(12) United States Patent
Huang et al.

(10) Patent No.: US 9,853,169 B1
(45) Date of Patent: Dec. 26, 2017

(54) STACKED CAPACITOR STRUCTURE

(71) Applicant: Realtek Semiconductor Corporation, Hsinchu (TW)

(72) Inventors: Kai-Yi Huang, Taipei (TW); Sheng-Hung Lin, New Taipei (TW); Yuh-Sheng Jean, Hsinchu County (TW); Ta-Hsun Yeh, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/297,120

(22) Filed: Oct. 18, 2016

(30) Foreign Application Priority Data

Jul. 29, 2016 (TW) .............................. 105124129 A

(51) Int. Cl.
*H01L 29/93* (2006.01)
*H01L 29/94* (2006.01)
*H01L 29/08* (2006.01)
*H01L 49/02* (2006.01)
*H01L 29/10* (2006.01)
*H01L 23/535* (2006.01)
*H01L 27/06* (2006.01)

(52) U.S. Cl.
CPC ............ *H01L 29/94* (2013.01); *H01L 23/535* (2013.01); *H01L 27/0629* (2013.01); *H01L 28/10* (2013.01); *H01L 28/60* (2013.01); *H01L 28/91* (2013.01); *H01L 29/0843* (2013.01); *H01L 29/107* (2013.01); *H01L 29/93* (2013.01)

(58) Field of Classification Search
CPC ........ H01L 21/70; H01L 21/702; H01L 21/71
See application file for complete search history.

(56) References Cited

U.S. PATENT DOCUMENTS

| | | |
|---|---|---|
| 6,593,838 B2 | 7/2003 | Yue |
| 8,106,479 B1 | 1/2012 | Nathawad et al. |
| 8,988,852 B2 | 3/2015 | Signoff et al. |
| 2005/0206465 A1* | 9/2005 | Okamoto ............. H03B 5/1228 331/177 V |
| 2006/0006431 A1 | 1/2006 | Jean et al. |
| 2007/0126078 A1 | 6/2007 | Huang et al. |
| 2008/0238569 A1 | 10/2008 | Matsuo |
| 2016/0148929 A1* | 5/2016 | Lee .................... H01L 27/0288 257/531 |

* cited by examiner

*Primary Examiner* — Cheung Lee
(74) *Attorney, Agent, or Firm* — CKC & Partners Co., Ltd.

(57) ABSTRACT

A stacked capacitor structure includes a MOS varactor and a stacked capacitor. The stacked capacitor is electrically connected to the MOS varactor. The MOS varactor includes a substrate, a gate, a first source/drain and a second source/drain. The substrate has a well, and the gate is positioned over the well. The first source/drain and the second source/drain are formed in the well and positioned at opposing sides of the gate. The stacked capacitor includes a plurality of metal layers. The metal layers are spaced from each other, stacked above the gate, and positioned below an inductive element.

19 Claims, 10 Drawing Sheets

STACKED CAPACITOR STRUCTURE

RELATED APPLICATION

This application claims priority to Taiwanese Application Serial Number 105124129, filed Jul. 29, 2016, which is herein incorporated by reference.

BACKGROUND

Field of Invention

The present invention relates to devices. More particularly, the present invention relates to devices having stacked capacitor structure.

Description of Related Art

Since inductor/transformer of integrated circuits are formed on a silicon substrate, electromagnetic energy generated by the operation of the inductor/transformer can be coupled with the silicon substrate, to cause substrate losses, and therefore the quality factor of the inductor/transformer is reduced.

The electromagnetic energy is coupled to the substrate through the displacement current which flows through the substrate to nearby grounds. In general, the resistivity of the silicon substrate is about 10-15 ohm-cm, and therefore the current flowing through the silicon substrate will cause energy loss. If the eddy current effect is not considered, there are two ideal modals of the substrate of the inductor/transformer to allow the substrate losses to be close to zero. In one ideal modal, the resistance of the substrate is infinite; in the other ideal modal, the resistance of the substrate is zero. However, these two ideal modals cannot be accomplished in standard CMOS processes. In practice, a ground shield with lower resistance is placed on the silicon substrate so as to reduce the substrate losses. Moreover, the eddy current effect also results in the substrate losses. In order to avoid the occurrence of the eddy current effect on the ground shield, the ground shield is cut in a special pattern to prevent the induced current from being formed.

SUMMARY

The following presents a simplified summary of the disclosure in order to provide a basic understanding to the reader. This summary is not an extensive overview of the disclosure and it does not identify key/critical components of the present invention or delineate the scope of the present invention. Its sole purpose is to present some concepts disclosed herein in a simplified form as a prelude to the more detailed description that is presented later.

According to embodiments of the present disclosure, the present disclosure provides a stacked capacitor structure to solve or circumvent aforesaid problems and disadvantages.

In one embodiment, the stacked capacitor structure includes a MOS varactor and a stacked capacitor. The stacked capacitor is electrically connected to the MOS varactor. The MOS varactor includes a substrate, a gate, a first source/drain and a second source/drain. The substrate has a well, and the gate is positioned over the well. The first source/drain and the second source/drain are formed in the well and positioned at opposing sides of the gate. The stacked capacitor includes a plurality of metal layers. The metal layers are spaced from each other, stacked above the gate, and positioned below an inductive element.

In view of the foregoing, the present disclosure provides the stacked capacitor structure as a high-performance ground shield for the inductive element (e.g., inductor/transformer of integrated circuits), so as to avoid losses resulted from that the electromagnetic energy is coupled to the substrate (e.g., a silicon substrate), thereby improving the quality factor of the inductive element. Moreover, the present disclosure fully utilizes an area under the inductive element under to make the stacked capacitor.

Many of the attendant features will be more readily appreciated, as the same becomes better understood by reference to the following detailed description considered in connection with the accompanying drawings.

BRIEF DESCRIPTION OF THE DRAWINGS

The present description will be better understood from the following detailed description read in light of the accompanying drawing, wherein.

DETAILED DESCRIPTION

Figure 1:
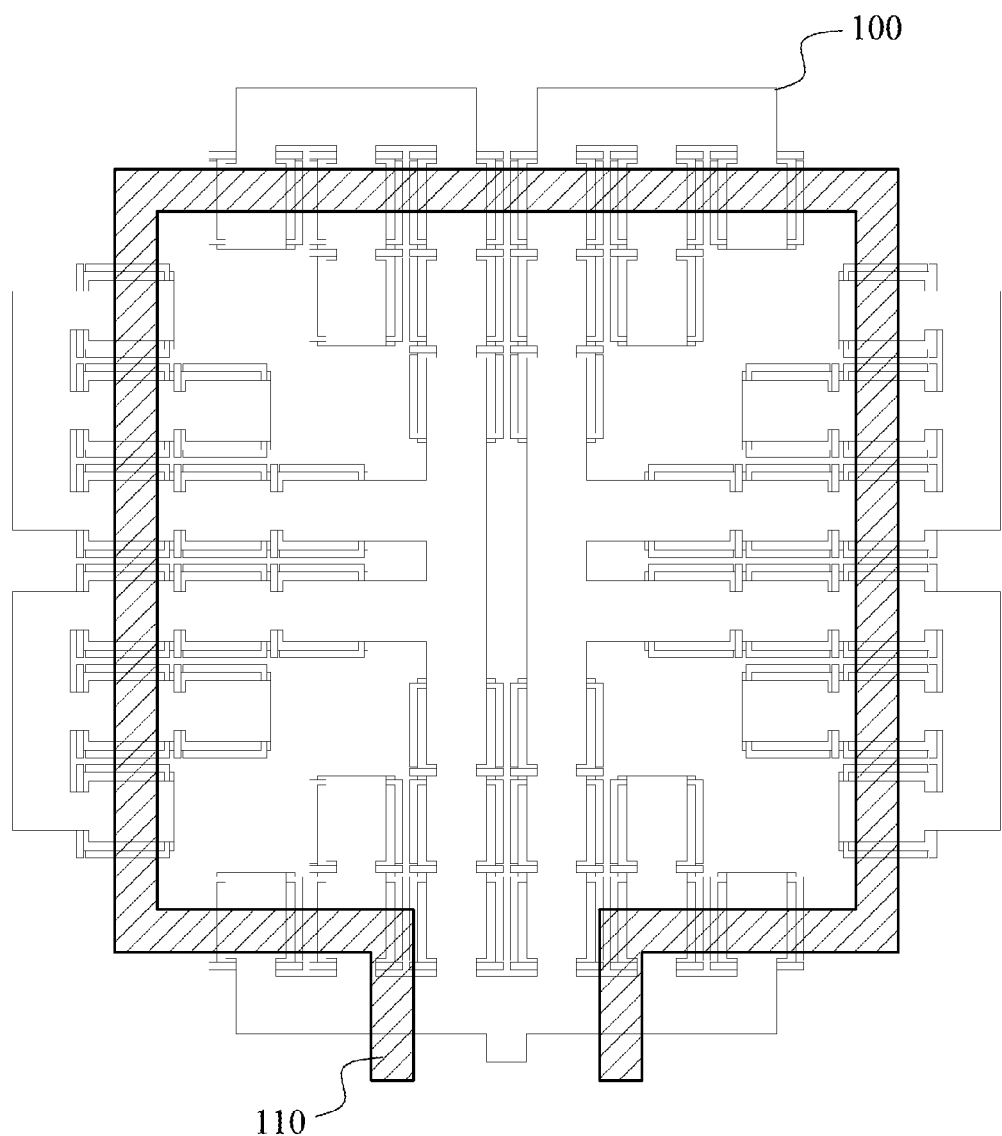
FIG. 1 is a top view of a stacked capacitor structure according to a first embodiment of the present disclosure.

In the following detailed description, for purposes of explanation, numerous specific details are set forth in order to attain a thorough understanding of the disclosed embodiments. In accordance with common practice, like reference numerals and designations in the various drawings are used to indicate like elements/parts. Moreover, well-known elements or method steps are schematically shown or omitted in order to simplify the drawing and to avoid unnecessary limitation to the claimed invention.

In the detailed embodiment and the claims, unless otherwise indicated, the article "a" or "the" refers to one or more than one of the word modified by the article "a" or "the."

Through the present specification and the annexed claims, the description involving the "electrical connection" refers to the cases where one component is electrically connected to another component indirectly via other component(s), or one component is electrically connected to another component directly without any other component.

FIG. 1 is a top view of a stacked capacitor structure 100 according to a first embodiment of the present disclosure. As illustrated in FIG. 1, the stacked capacitor structure 100 is positioned below the inductive element 110. In the first embodiment, the inductive element 110 is an inductor, a transformer or the like. As to the first embodiment, the pattern of a metal layer of a stacked capacitor is illustrated with FIG. 4 as explained below. The layouts of various layer of the stacked capacitor structure 100 are illustrated with FIGS. 6-10 as explained below.

Figure 2:
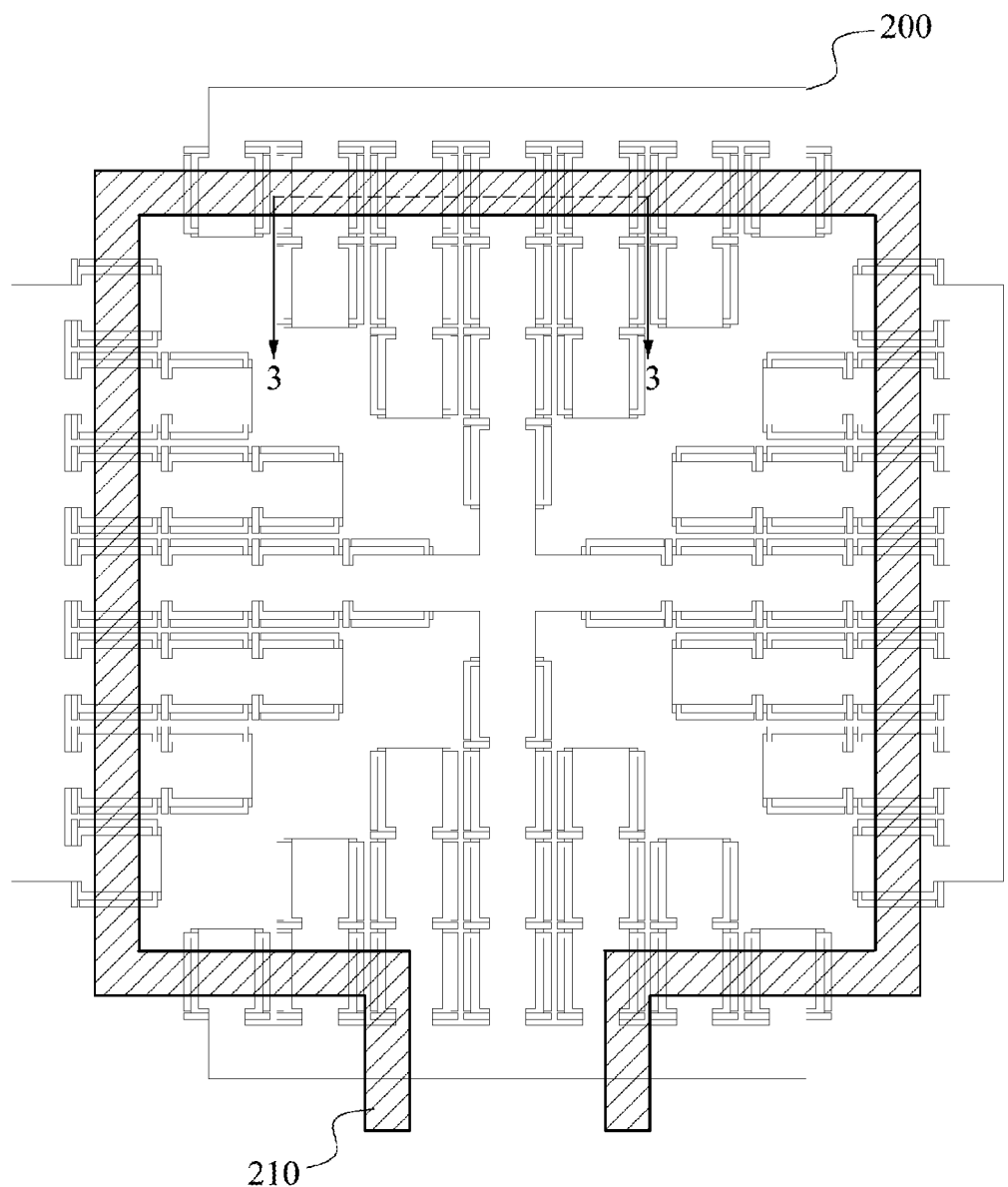
FIG. 2 is a top view of a stacked capacitor structure according to a second embodiment of the present disclosure.

FIG. 2 is a top view of a stacked capacitor structure 200 according to a second embodiment of the present disclosure. As illustrated in FIG. 1, the stacked capacitor structure 200 is positioned below the inductive element 210. In the second embodiment, the inductive element 210 is an inductor, a transformer or the like. As to the second embodiment, the pattern of a metal layer of a stacked capacitor is illustrated with FIG. 5 as explained below. The schematic cross section of the stacked capacitor structure 200 is illustrated with FIG. 3 as explained below.

Figure 3:
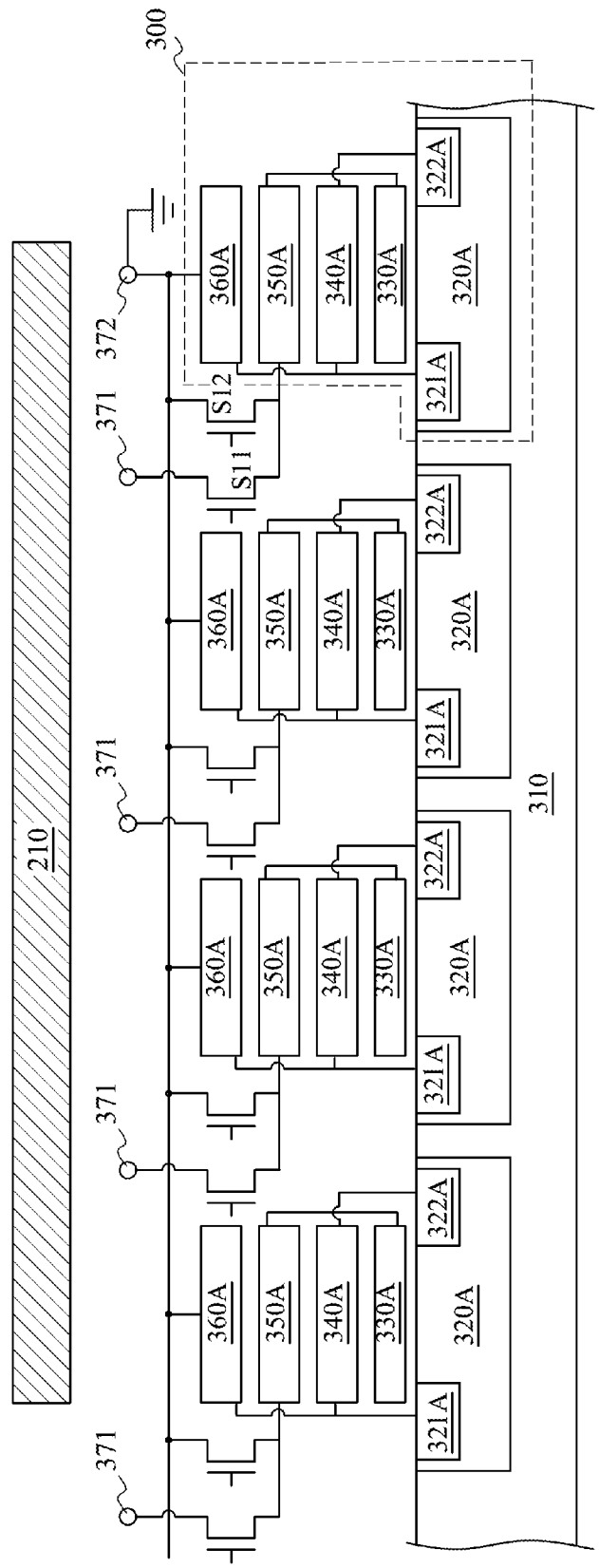
FIG. 3 is a schematic cross section taken along the line 3-3 in FIG. 2.

FIG. 3 is a schematic cross section taken along the line 3-3 in FIG. 2. As to FIG. 2, representative examples of capacitance 300 and arrangements are described below to simplify the present disclosure. The capacitance 300 includes a MOS (Metal-Oxide-Semiconductor) varactor and a stacked capacitor electrically connected to each other. The MOS varactor includes a substrate 310, a gate 330A, a first source/drain 321A and a second source/drain 322A. The stacked capacitor includes a first metal layer 340A, a second metal layer 350A and a third metal layer 360A.

In the MOS varactor, the substrate 310 has a well 320A. The gate 330A is positioned above the well 320A. The first source/drain 321A and the second source/drain 322A are formed in the well 320A and positioned at opposing sides of the gate 330A. In the stacked capacitor, the metal layers 340A, 350A and 360A are spaced from each other, stacked above the gate 330A, and positioned below the inductive element 210.

The substrate 310 is a P-type the substrate or a N-type the substrate. In the MOS varactor, the first source/drain 321A, the second source/drain 322A and the well 320A are semiconductor regions with the same conductivity type. For example, these semiconductor regions are P-type semiconductor regions or N-type semiconductor regions.

The odd-numbered metal layers 340A and 360A above the gate 330A serve as a first capacitor electrode (e.g., a negative electrode), the even-numbered the metal layer 350A above gate 330A serves as a second capacitor electrode (e.g., a positive electrode). The odd-numbered metal layer 340A and 360A are electrically connected to the first source/drain 321A and the second source/drain 322A, and the even-numbered metal layer 350A is electrically connected to the gate 330A. It should be noted that aforesaid "electrical connection" can be accomplished by contact and/or via structure, but the present disclosure is not limited thereto.

Moreover, the capacitance 300 is electrically connected to a first switch S11 and a second switch S12 (e.g., MOS transistor). Specifically, the first switch S11 has one terminal electrically connected to the anode 371, and the first switch S11 has another terminal electrically connected to the second capacitor electrode (i.e., the metal layer 350A). The second switch S12 has one terminal electrically connected to the cathode 372 and the first capacitor electrode (i.e., the metal layers 340A and 360A), and the second switch S12 has another terminal electrically connected to the second capacitor electrode.

In short, the first switch S11 and the capacitance 300 are connected in series, and the second switch S12 and the capacitance 300 are connected in parallel. The on/off states of the first and second switch S11 and S12 can be controlled, and thus the adjustment of the overall capacitance value of the stacked capacitor structure 200 is programmable. For example, the first switch S11 is turned off, so that the capacitance 300 can be electrically disconnected from the stacked capacitor structure 200; the second switch S12 is turned on, so that the capacitance 300 is shorted to reduce the overall capacitance value and to prevent a contact of the MOS varactor from being floating.

Alternatively, in some embodiments, the first switch S11 and/or the second switch S12 will be omitted if there is on consideration for programmable control. Those with ordinary skill in the art may flexibly choose a suitable structure depending on the desired application.

Moreover, a schematic cross section of the stacked capacitor structure 100 of FIG. 1 is substantially equal or similar to the schematic cross section as shown in FIG. 3, and thus, are not repeated herein.

Figure 4:
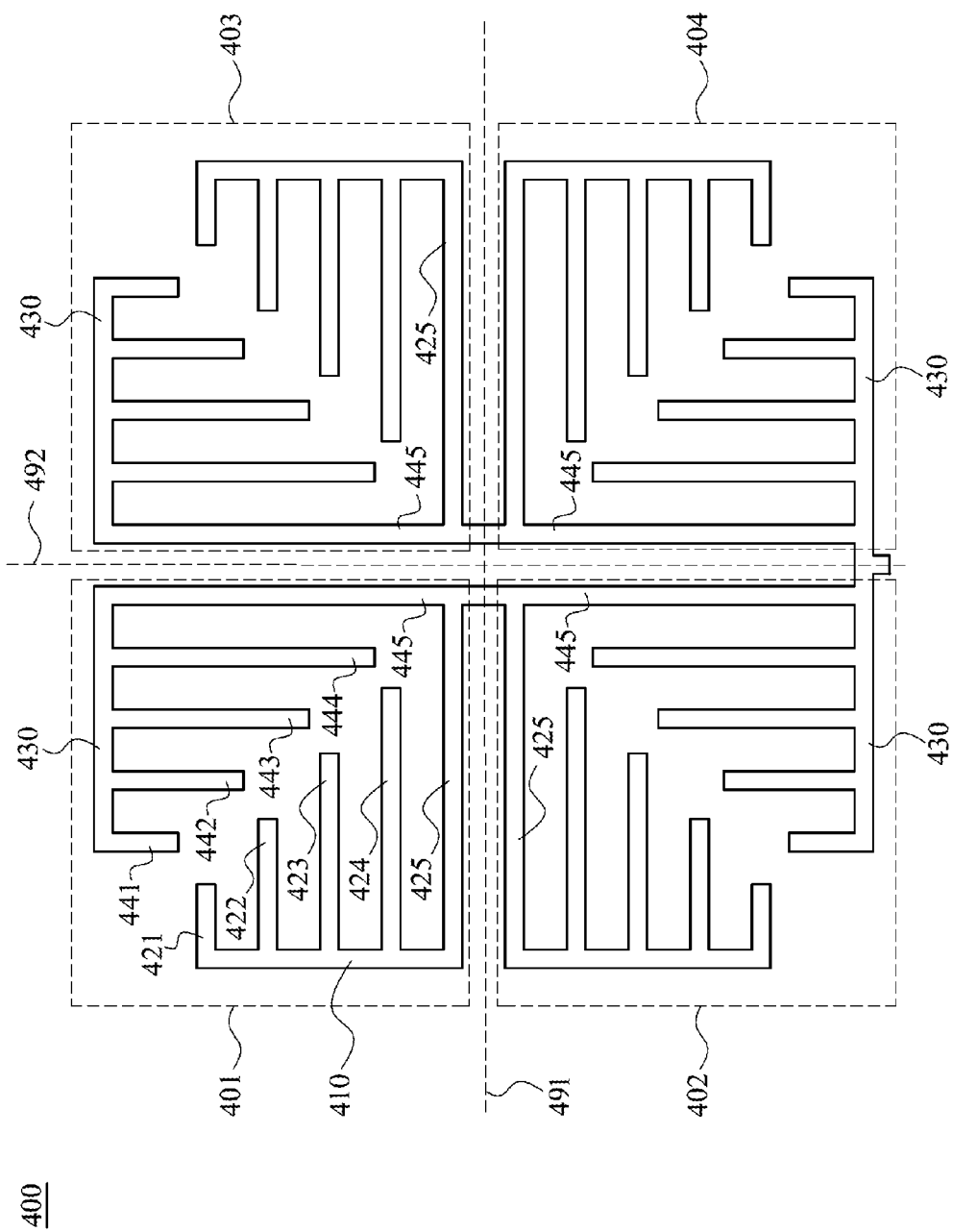
FIG. 4 is a top view of a metal layer according to the first embodiment of the present disclosure.

For a more complete understanding of the layout of the metal layer of the stacked capacitor of the stacked capacitor structure 100 of FIG. 1, refer to the a metal layer 400 as shown in FIG. 4. It should be noted that the amount of first metal strip 421-425 and second metal strips 441-445 for illustrative purposes only. Those with ordinary skill in the art may flexibly increase or decrease the amount of the first and second metal strips to meet the arrangement of the stacked capacitor structure 100.

As illustrated in FIG. 4, the pattern of the metal layer 400 includes a plurality of comb units 401-404 disposed symmetrically. Therefore, the metal layer 400 can serve as a patterned ground shield. It should be noted that a solid ground shield may cause an eddy current effect for the inductive element 110, and thus an induced current form a reversing magnetic field on the solid ground shield, thereby increasing losses of the element.

Representative examples of the comb unit 401 and arrangements are described below to simplify the present disclosure. The comb unit 401 includes a first metal connector 410, first metal strips 421-425, a second metal connector 430 and second metal strips 441-445.

In structure, the first metal connector 410 is connected to the first metal strips 421-425. The first metal strips 421-425 are disposed in parallel to each other and are perpendicular to the first metal connector 410. The lengths of the first metal strips 421-425 decrease gradually from one terminal to the other terminal of the first metal connector 410. Similarly, the second metal connector 430 is connected to the second metal strip 441-445. The second metal strips 441-445 are disposed in parallel to each other and are perpendicular to the second metal connector 430. The lengths of the second metal strips 441-445 decrease gradually from one terminal to the other terminal of the second metal connector 430. The second metal strips 441-445 are perpendicular to the first metal strips 421-425, and the second metal strips 441-445 arranged symmetrically to the first metal strips 421-425.

In the comb unit 401, a longest one of the first metal strips 421-425 is connected to a longest one of the second metal strips 441-445, and ends of others of the first and second metal strips 421-425 and 441-445 are disconnected from each other.

For a more complete understanding of each comb unit, the comb units 401-404 are distinguished into a first comb unit 401, a second comb unit 402, a third comb unit 403 and a fourth comb unit 404. The first and third comb units 401 and 403 are symmetric to the second and fourth comb units 402 and 404 with respect to a first axis 491 of symmetry. The first and second comb units 401 and 402 are symmetric to the third and fourth comb units 403 and 404 with respect to a second axis 492 of symmetry, and the first and second axes 491 and 492 of symmetry are perpendicular to each other at a central portion of the pattern surrounded by the comb units 401, 402, 403 and 404.

In the metal layer 400, the first comb unit 401 is connected to the second comb unit 402, the third comb unit 403 is connected to the fourth comb unit 404, the second comb unit 402 is connected to the fourth comb unit 404, and the first comb unit 401 and the third comb unit 403 are disconnected from each other, so as to prevent the induced current from being formed on the metal layer 400.

Specifically, longest first and second metal strips 425 and 445 of the first comb unit 401 are connected to longest first and second metal strips 425 and 445 of the second comb unit 402. Similarly, longest first and second metal strips 425 and 445 of the third comb unit 403 are connected to longest first and second metal strips 425 and 445 of the fourth comb unit 404. The second metal connector 430 of the second comb unit 402 is connected to the second metal connector 430 of the fourth comb unit 404. The second metal connector 430 of the first comb unit 401 and the second metal connector 430 of the third comb unit 403 are disconnected from each other.

Figure 5:
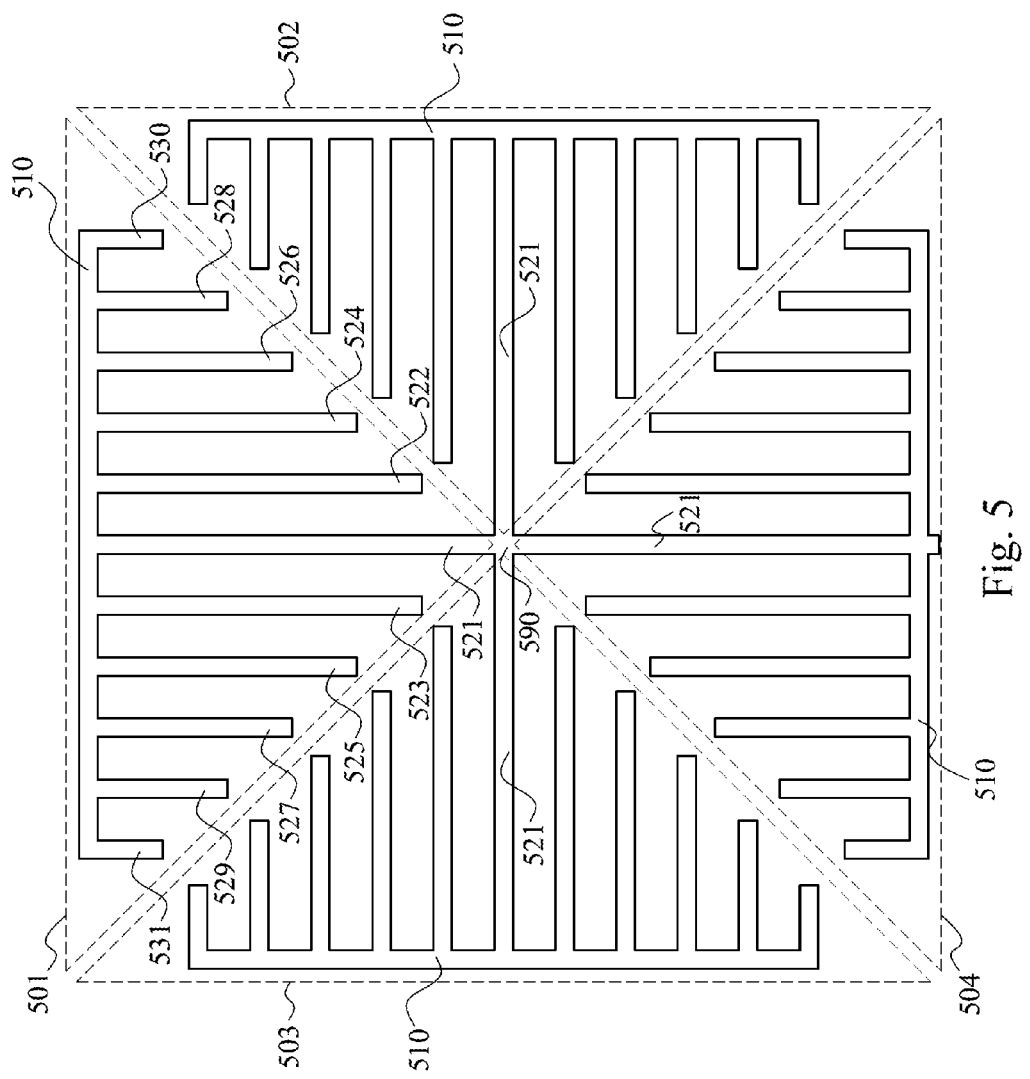
FIG. 5 is a top view of a metal layer according to the second embodiment of the present disclosure.

For a more complete understanding of the layout of the metal layer of the stacked capacitor of the stacked capacitor structure 200 of FIG. 2, refer to the a metal layer 500 as shown in FIG. 5. It should be noted that the amount of metal strips 521-531 for illustrative purposes only. Those with ordinary skill in the art may flexibly increase or decrease the amount of the first and second metal strips to meet the arrangement of the stacked capacitor structure 200.

As illustrated in FIG. 5, the pattern of the metal layer 500 includes a plurality of comb units 501-504 disposed symmetrically. For example, the pattern of the metal layer 500 has rotational symmetry of order four. Therefore, the metal layer 500 can serve as a patterned ground shield to avoid the eddy current effect.

Representative examples of the comb unit 501 and arrangements are described below to simplify the present disclosure. The comb unit 501 includes a metal connector 510 and metal strips 521-531. In structure, the metal connector 510 is connected to the metal strips 521-531. The metal strips 521-531 are disposed in parallel to each other. The metal connector 510 is perpendicular to the metal strips 521-531. The lengths of the metal strips 521-531 decrease gradually from a center of the metal connector 510 to both sides of the metal connector 510.

In the metal layer 500, a longest metal strip 521 of the metal strips of each of the comb units 501-504 is connected to the center of the metal connector and extends to a central portion 590 of the pattern of the metal layer 500. The longest metal strips 521 of the comb units 501-504 are connected to each other at the central portion 590, and ends of others of the comb units 501-504 are disconnected from each other, so as to prevent the induced current from being formed on the metal layer 500.

In some embodiments, stacked capacitor structure can be divided into a plurality of capacitors for various circuits. For example, some capacitors are provided for a PLL Loop filter, and the other capacitors serve as decoupling capacitors. For example, the comb units 501-504 are connected through switches (e.g., MOS transistors), and/or the comb units 401-404 are connected through switches. The switches can be turned on or off by programmable control, and those with ordinary skill in the art may flexibly choose the on/off state of the switches depending on the desired application.

For a more complete understanding of the layouts of various layer of the stacked capacitor structure 100, embodiments with FIGS. 6-10 are explained as below.

Figure 6:
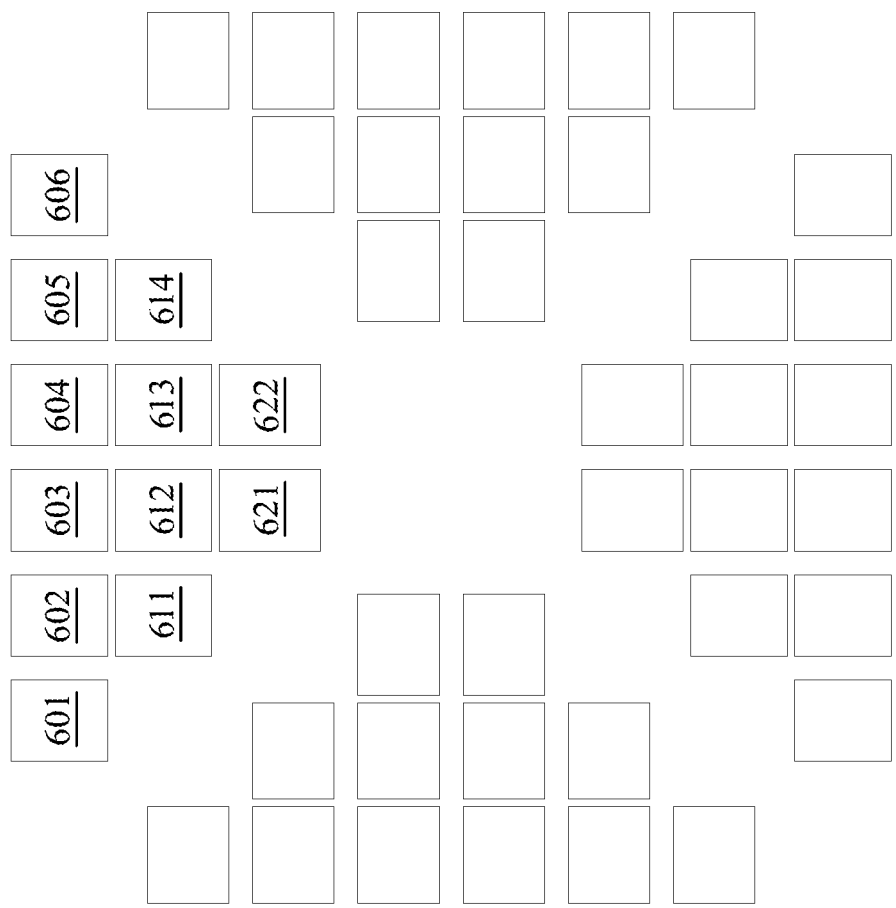
FIG. 6 is a top view of a well of a MOS varactor in FIG. 1.
Figure 7:
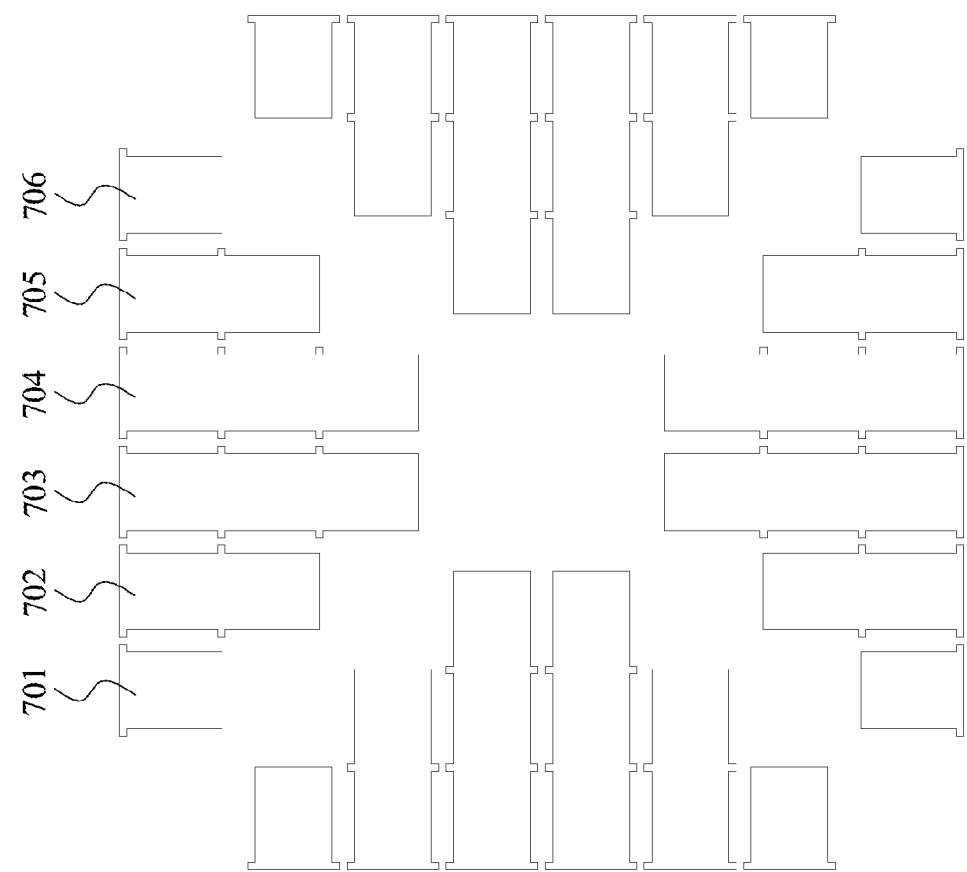
FIG. 7 is a top view of a gate of the MOS varactor in FIG. 1.

Referring to FIGS. 6 and 7, the gate 701 is disposed over the well 601. The gate 702 is disposed over the wells 602 and 611. The gate 703 is disposed over the wells 603, 612 and 621. The gate 704 is disposed over the wells 604, 613 and 622. The gate 705 is disposed over the wells 605 and 614. The gate 706 is disposed over the well 606.

Figure 8:
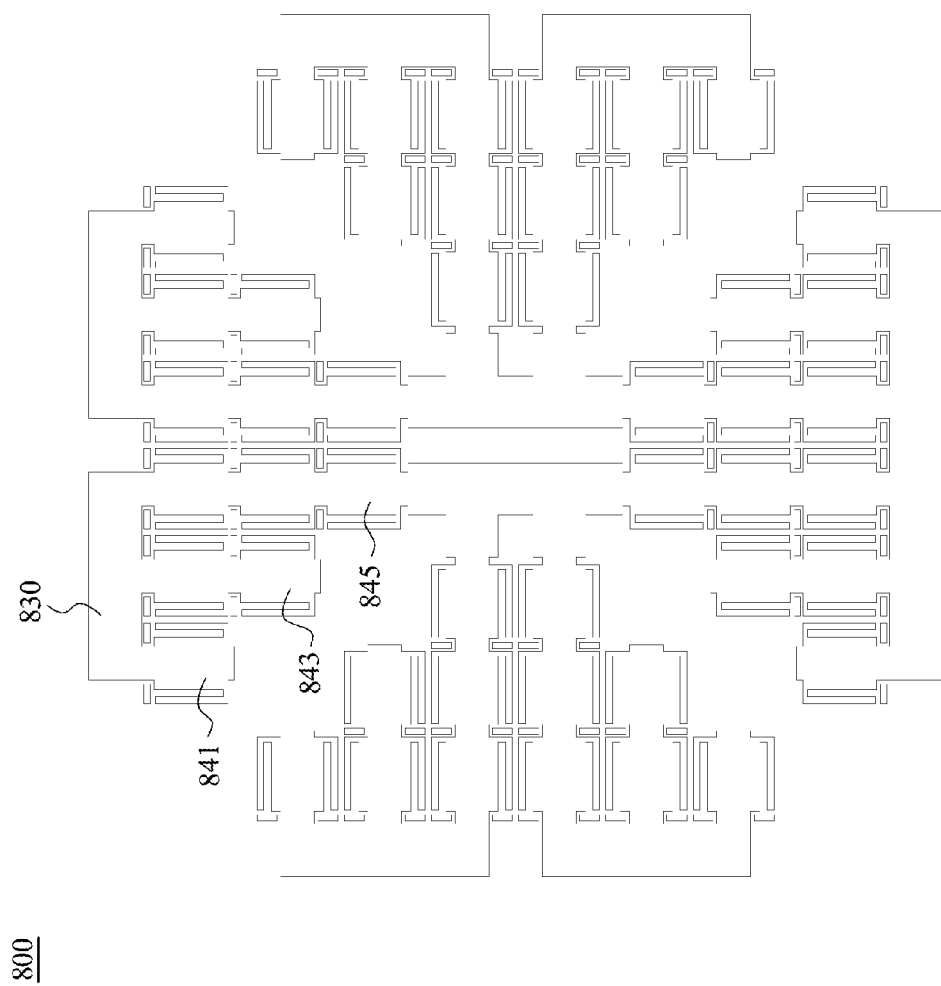
FIG. 8 is a top view of a first metal layer of the stacked capacitor in FIG. 1.
Figure 9:
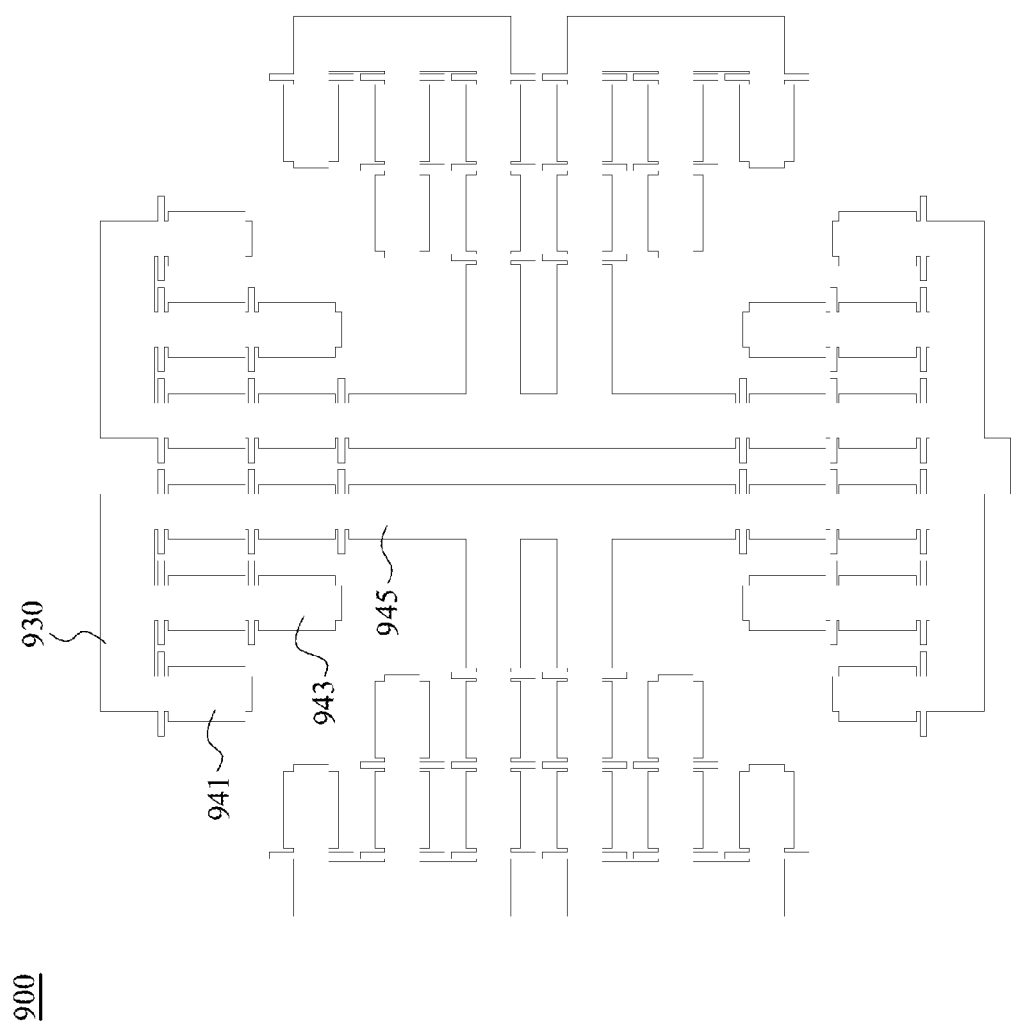
FIG. 9 is a top view of a second metal layer of the stacked capacitor in FIG. 1.
Figure 10:
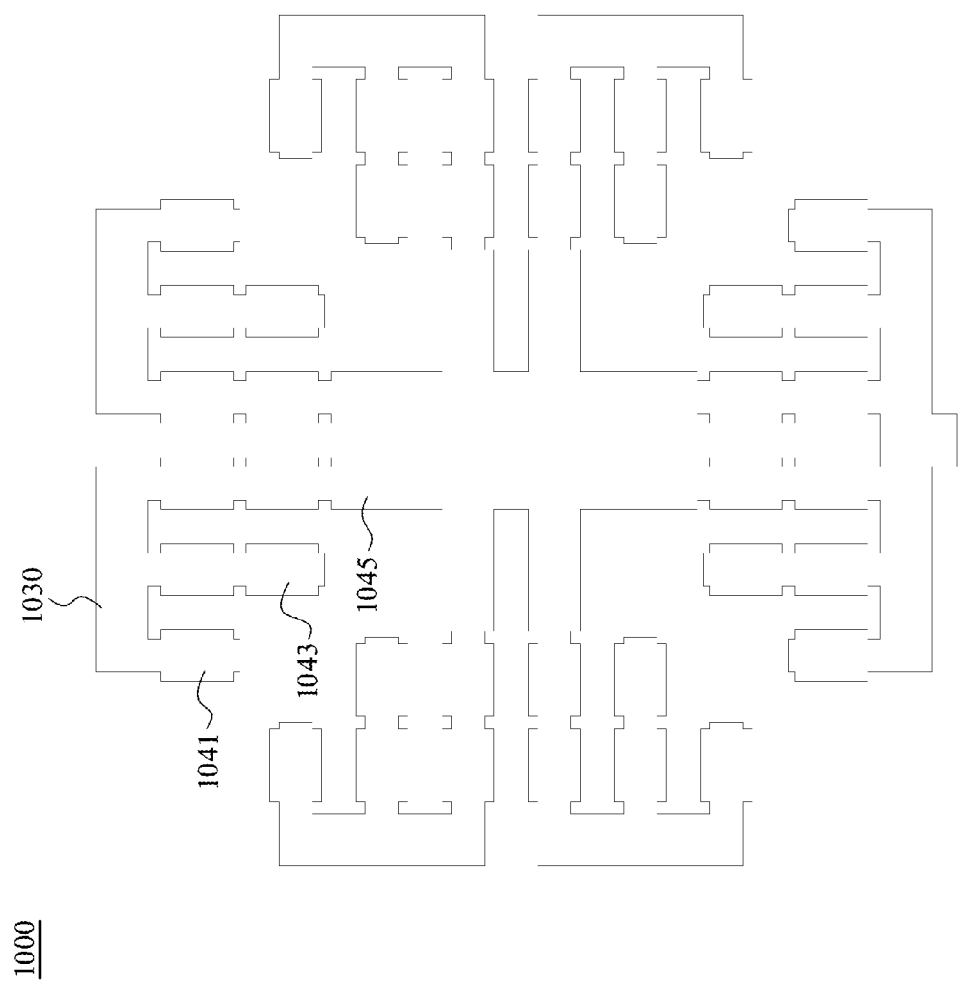
FIG. 10 is a top view of a third metal layer of the stacked capacitor in FIG. 1.

FIGS. 8-10 illustrate the first, second and third metal layers 800, 900 and 1000. Referring to FIGS. 7-10, the metal strips 841, 843 and 845 connected to the metal connector 830 are disposed over the gates 701, 702 and 703 respectively. The metal strips 941, 943 and 945 connected to the metal connector 930 are disposed over the metal strips 841, 843 and 845 respectively. The metal strips 1041, 1043 and 1045 are disposed over the metal strips 941, 943 and 945 respectively.

In FIGS. 8-10, the extending patterns of opposing sides of metal strips of various metal layers are different from each other, and the extending patterns provides connections for the contact and/or via structure. Furthermore, each metal strip as illustrated in FIGS. 8-10 is an elongated structure, but the present disclosure is not limited thereto. In some embodiments, the metal strip can be a comb structure. Those with ordinary skill in the art may flexibly choose the suitable structure depending on the desired application.

In some approaches, a polycrystalline silicon gate layer of a MOS capacitor serves as the patterned ground shield only; however, the parasitic resistance of the polycrystalline is too large, and thus, the ground shield effect is poor. The capacitance value per unit area of the patterned capacitance is limited to the MOS capacitor itself. Even if a MOM capacitor is utilized to serve as the patterned ground shield, the capacitance value per unit area is not enough.

Compared with above-mentioned approaches, in the present disclosure, any of the stacked capacitor structures 100 and 200 utilize the MOS varactor constructing a portion of the patterned ground shield. The plurality of metal layers above the MOS varactor can serve as the stacked capacitor for increasing the capacitance value per unit area. The metal layers also serve as another portion of the patterned ground shield for decreasing the resistance of the shield itself, so as to avoid losses resulted from that any of the inductive elements 110 and 210 is coupled to the substrate 310, thereby improving the quality factors of the inductive elements 110 and 210. Moreover, the present disclosure fully utilizes an area under any of the inductive elements 110 and 210 under to make the stacked capacitor.

Although various embodiments of the invention have been described above with a certain degree of particularity, or with reference to one or more individual embodiments, they are not limiting to the scope of the present disclosure. Those with ordinary skill in the art could make numerous alterations to the disclosed embodiments without departing from the spirit or scope of this invention. Accordingly, the protection scope of the present disclosure shall be defined by the accompany claims.

What is claimed is:

1. A stacked capacitor structure, comprising:
   a MOS (Metal-Oxide-Semiconductor) varactor, comprising:
   a substrate having a well;
   a gate positioned on the well; and
   a first source/drain and a second source/drain formed in the well and positioned at opposing sides of the gate;
   a stacked capacitor electrically connected to the MOS varactor, wherein the stacked capacitor comprises a plurality of metal layers spaced from each other, stacked above the gate, and positioned below an inductive element, wherein each first metal layer of the metal layers above the gate serves as a first capacitor electrode, and each second metal layer of the metal layers above the gate serves as a second capacitor electrode, wherein the each first metal layer and the each second metal layer are alternately arranged; and a first switch having one terminal electrically connected to an anode, and another terminal electrically connected to the second capacitor electrode.

2. The stacked capacitor structure of claim 1, wherein the first source/drain, the second source/drain and the well are semiconductor regions with the same conductivity type.

3. The stacked capacitor structure of claim 2, wherein the first source/drain, the second source/drain and the well are N-type semiconductor regions.

4. The stacked capacitor structure of claim 2, wherein the first source/drain, the second source/drain and the well are P-type semiconductor regions.

5. The stacked capacitor structure of claim 1, wherein the substrate is a P-type the substrate or a N-type the substrate.

6. The stacked capacitor structure of claim 1, wherein the each first metal layer of the metal layers above the gate is electrically connected to the first source/drain and the second source/drain.

7. The stacked capacitor structure of claim 1, wherein the each second metal layer of the metal layers above the gate is electrically connected to the gate.

8. The stacked capacitor structure of claim 1, further comprising:

a second switch having one terminal electrically connected to a cathode and the first capacitor electrode, and another terminal electrically connected to the second capacitor electrode.

9. The stacked capacitor structure of claim 1, wherein a pattern of any of the metal layers comprises:

a plurality of the comb units disposed symmetrically.

10. The stacked capacitor structure of claim 9, wherein each of the comb units comprises:

a plurality of the metal strips disposed in parallel to each other; and a metal connector connected to the metal strips, wherein lengths of the metal strips decrease gradually from a center of the metal connector to both sides of the metal connector.

11. The stacked capacitor structure of claim 10, wherein the number of the comb units is four, and a longest metal strip of the metal strips of each of the comb units is connected to the center of the metal connector and extends to a central portion of the pattern.

12. The stacked capacitor structure of claim 11, wherein the longest metal strips of the comb units are connected to each other at the central portion, and ends of others of the comb units are disconnected from each other.

13. The stacked capacitor structure of claim 9, wherein each of the comb units comprises:

a plurality of first metal strips disposed in parallel to each other;

a first metal connector connected to the first metal strips, wherein lengths of the first metal strips decrease gradually from one terminal to another terminal of the first metal connector;

a plurality of second metal strips disposed in parallel to each other, and being perpendicular to the first metal strips; and a second metal connector connected to the second metal strips, and being perpendicular to the first metal connector, wherein lengths of the second metal strips decrease gradually from one terminal to another terminal of the second metal strip, and the second metal strips are arranged symmetrically to the first metal strips.

14. The stacked capacitor structure of claim 13, wherein a longest one of the first metal strips is connected to a longest one of the second metal strips, and ends of others of the first and second metal strips are disconnected from each other.

15. The stacked capacitor structure of claim 14, wherein the comb units comprises a first comb unit, a second comb unit, a third comb unit and a fourth comb unit, the first and third comb units are symmetric to the second and fourth comb units with respect to a first axis of symmetry, the first and second comb units are symmetric to the third and fourth comb units with respect to a second axis of symmetry, and the first and second axes of symmetry are perpendicular to each other at a central portion of the pattern surrounded by the comb units.

16. The stacked capacitor structure of claim 15, wherein the first comb unit is connected to the second comb unit, the third comb unit is connected to the fourth comb unit, the second comb unit is connected to the fourth comb unit, and the first comb unit and the third comb unit are disconnected from each other.

17. The stacked capacitor structure of claim 16, wherein longest first and second metal strips of the first comb unit are connected to longest first and second metal strips of the second comb unit, and longest first and second metal strips of the third comb unit are connected to longest first and second metal strips of the fourth comb unit.

18. The stacked capacitor structure of claim 16, wherein the second metal connector of the second comb unit is connected to the second metal connector of the fourth comb unit.

19. The stacked capacitor structure of claim 1, wherein the inductive element is an inductor or a transformer.

* * * * *